US010879336B2

(12) United States Patent
Jin et al.

(10) Patent No.: US 10,879,336 B2
(45) Date of Patent: Dec. 29, 2020

(54) CAPACITOR

(71) Applicant: SAMSUNG DISPLAY CO., LTD., Yongin-si (KR)

(72) Inventors: Guang-Hai Jin, Yongin-si (KR); Jae-Beom Choi, Yongin-si (KR); Se-Hun Park, Yongin-si (KR); Jae-Seol Cho, Yongin-si (KR)

(73) Assignee: SAMSUNG DISPLAY CO., LTD., Yongin (KR)

( * ) Notice: Subject to any disclaimer, the term of this patent is extended or adjusted under 35 U.S.C. 154(b) by 0 days.

(21) Appl. No.: 16/286,886

(22) Filed: Feb. 27, 2019

(65) Prior Publication Data

US 2019/0198601 A1 Jun. 27, 2019

Related U.S. Application Data

(63) Continuation of application No. 15/060,682, filed on Mar. 4, 2016, now Pat. No. 10,224,384, which is a continuation of application No. 14/249,520, filed on Apr. 10, 2014, now Pat. No. 9,281,418.

(30) Foreign Application Priority Data

Jul. 5, 2013 (KR) .................. 10-2013-0079283

(51) Int. Cl.
*H01L 27/32* (2006.01)
*H01L 29/94* (2006.01)
*H01L 29/66* (2006.01)
*H01L 49/02* (2006.01)

(52) U.S. Cl.
CPC ...... *H01L 27/3276* (2013.01); *H01L 27/3265* (2013.01); *H01L 28/60* (2013.01); *H01L 29/66181* (2013.01); *H01L 29/94* (2013.01)

(58) Field of Classification Search
None
See application file for complete search history.

(56) References Cited

U.S. PATENT DOCUMENTS

| 9,281,418 | B2* | 3/2016 | Jin | .......................... H01L 28/60 |
| 2003/0057489 | A1 | 3/2003 | Yamazaki | |
| 2011/0170028 | A1* | 7/2011 | Kaise | ................ G02F 1/136286 |
| | | | | 349/38 |
| 2013/0009272 | A1* | 1/2013 | Sakurai | .................. H01L 27/13 |
| | | | | 257/496 |
| 2016/0086539 | A1 | 3/2016 | Mizukoshi | |

FOREIGN PATENT DOCUMENTS

| KR | 10-2011-0099996 A | 9/2011 |
| KR | 10-2012-0129592 A | 11/2012 |

* cited by examiner

*Primary Examiner* — Long Pham
(74) *Attorney, Agent, or Firm* — Kile Park Reed & Houtteman PLLC

(57) ABSTRACT

A capacitor includes an active layer, a gate insulation layer on the active layer, a gate electrode on the gate insulation layer, an interlayer insulating layer on the gate electrode, and a first electrode on the interlayer insulating layer and connected to the active layer through at least one contact hole.

21 Claims, 4 Drawing Sheets

CAPACITOR

CROSS-REFERENCE TO RELATED APPLICATIONS

This is a continuation application based on application Ser. No. 15/060,682, filed Mar. 4, 2016, which in turn is a continuation of application Ser. No. 14/249,520, filed Apr. 10, 2014, now U.S. Pat. No. 9,281,418 B2, issued Mar. 8, 2016, the entire contents of which is hereby incorporated by reference.

Korean Patent Application No. 10-2013-0079283, filed on Jul. 5, 2013, in the Korean Intellectual Property Office, and entitled: "Capacitor," is incorporated by reference herein in its entirety.

BACKGROUND

1. Field

Embodiments relate to a capacitor.

2. Description of the Related Art

An active patterning skip process performs a deposition process without performing an active patterning process. In such a process, a number of masks is reduced, but a gate is also deposited since the deposition process is performed without masks. The gate, which is an electrode for forming a capacitor, is deposited so it is difficult to dope the capacitor.

SUMMARY

An exemplary embodiment provides a capacitor including: an active layer; a gate insulation layer formed on the active layer; a gate electrode formed on the gate insulation layer; an interlayer insulating layer formed on the gate electrode; and a first electrode formed on the interlayer insulating layer and connected to the active layer through at least one contact hole.

The capacitor may further include an intrinsic semiconductor layer formed in an area overlapping an area in which the gate electrode is formed, wherein the intrinsic semiconductor layer and the active layer are formed on a same layer.

The capacitor may include a second electrode formed on the interlayer insulating layer and connected to the gate electrode through a contact hole.

The capacitor may further include a parasitic capacitor formed between the gate electrode and the active layer.

A first capacitor in an area in which the first electrode overlaps the gate electrode and the parasitic capacitor may be connected in parallel.

The gate electrode may include a plurality of grooves. The capacitor may further include a parasitic capacitor formed between the first electrode and an outline of the gate electrode.

The capacitor may further include an intrinsic semiconductor layer formed in an area overlapping the area in which the gate electrode is formed, wherein the intrinsic semiconductor layer and the active layer are formed on the same layer.

The capacitor may further include a first parasitic capacitor formed between the gate electrode and the active layer.

The capacitor may further include a second parasitic capacitor formed between the first electrode and an outline of the gate electrode.

A first capacitor in an area where the first electrode overlaps the gate electrode, the first parasitic capacitor, and the second parasitic capacitor may be connected in parallel.

The capacitor may further include a guard ring for wrapping a first capacitor in an area in which the gate electrode overlaps the first electrode.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
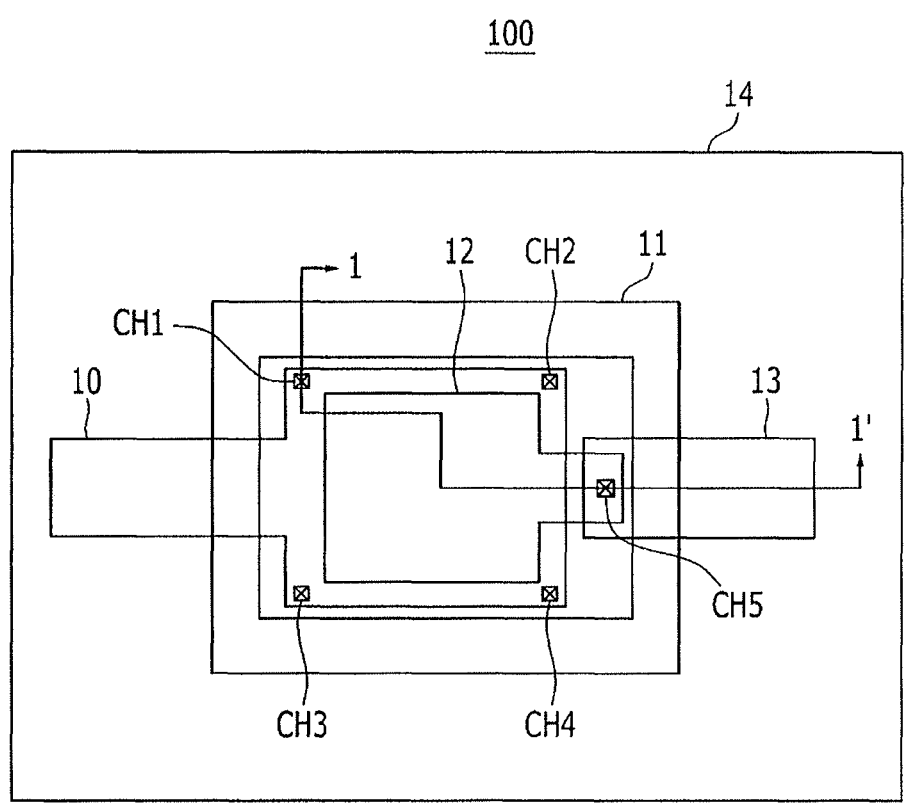
FIG. 1 illustrates a schematic top plan view of a capacitor according to an exemplary embodiment.

In the following detailed description, only certain exemplary embodiments have been shown and described, simply by way of illustration. As those skilled in the art would realize, the described embodiments may be modified in various different ways, all without departing from exemplary implementations. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

A capacitor according to an exemplary embodiment will now be described with reference to FIGS. 1-2.

FIG. 1 illustrates a top plan view of a capacitor according to an exemplary embodiment. FIG. 2 illustrates a cross-section along line 1-1' of FIG. 1.

As shown in FIG. 1, a capacitor 100 may include a first electrode 10, which is an upper electrode, and a gate electrode 12, which is a lower electrode. The first electrode 10 is connected to an active layer 14 through a plurality of contact holes, e.g., first through fourth contact holes CH1-CH4. The active layer 14 represents an area generated by doping an intrinsic semiconductor layer with a predetermined impurity. For example, the active layer 14 may be in a P+ doping state. A second electrode 13 is connected to the gate electrode 12 through a fifth contact hole CH5.

A guard ring 11 intercepts a leakage current between the capacitor 100 and another capacitor (not shown). The guard ring 11 is shown as a quadrangle for wrapping, e.g., surrounding, an area in which the capacitor 100 is formed. However, exemplary embodiments are not limited thereto.

Figure 2:
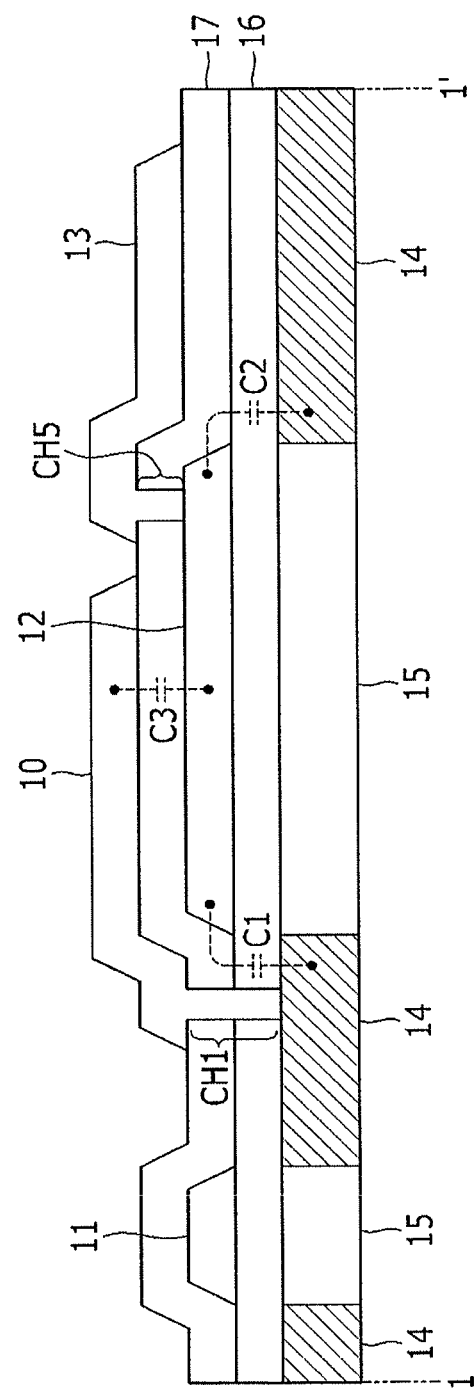
FIG. 2 illustrates a cross-section along line 1-1' of FIG. 1.

As shown in FIG. 2, an intrinsic semiconductor layer 15 is provided on a same layer as the active layer 14, e.g., the intrinsic semiconductor layer 15 and the active layer 14 may have substantially level bottom surfaces and a same thickness. An area overlapping the area in which the guard ring 11 and the gate electrode 12 are formed is the intrinsic semiconductor layer 15, which is not doped. In other words, as illustrated in FIG. 2, a first portion of the non-doped intrinsic semiconductor layer 15 may overlap the guard ring 11, and a second portion of the non-doped intrinsic semiconductor layer 15 may overlap the gate electrode 12, e.g., the intrinsic semiconductor layer 15 and the active layer 14 may be arranged so the active layer 14 may have a non-overlapping relationship with the guard ring 11 and with the gate electrode 12.

As further illustrated in FIG. 2, a gate insulation layer 16 is formed on the active layer 14 and the intrinsic semiconductor layer 15, and the gate electrode 12 and the guard ring 11 are formed on the gate insulation layer 16. That is, as illustrated in FIG. 2, the gate insulation layer 16 may be formed between a first layer, e.g., a layer including the active layer 14 and the intrinsic semiconductor layer 15, and a second layer, e.g., a layer including the gate electrode 12 and the guard ring 11. As such, the gate insulation layer 16 may be an insulator between the active layer 14 and the gate electrode 12.

As further illustrated in FIG. 2, an interlayer insulating layer 17 is formed on the gate insulation layer 16, the gate electrode 12, and the guard ring 11. The first electrode 10 and the second electrode 13 are formed on the interlayer insulating layer 17, so the first electrode 10 is connected to the active layer 14 through the contact holes, e.g., through the first contact hole CH1, (as well as alternatively or additionally through any of the second to fourth contact holes CH2-CH4 shown in FIG. 1), and the second electrode 13 is connected to the gate electrode 12 through the fifth contact hole CH5.

As the gate insulation layer 16 is an insulator between the active layer 14 and the gate electrode 12, and the first electrode 10 is connected to the active layer 14 through the plurality of contact holes, a parasitic capacitor is formed between the active layer 14 and the gate electrode 12 in the capacitor 100. That is, a capacitor in the area in which the first electrode 10 overlaps the gate electrode 12 is connected in parallel to the parasitic capacitor between the gate electrode 12 and the active layer 14.

In detail, as illustrated in FIG. 2, the first electrode 10, which is one electrode of the capacitor C3 shown with dotted lines, is connected to the active layer 14 through at least one contact hole, e.g., the first contact hole CH1. As such, parasitic capacitors (C1) and (C2) may be defined, e.g., connected, between the active layer 14 and the gate electrode 12, as illustrated by dotted lines in FIG. 2. Therefore, the capacitors (C1), (C2), and (C3) are connected in parallel.

When capacitance of the capacitor 100 is calculated and the parasitic capacitors are considered, a size of the capacitor 100 may be reduced, e.g., relatively to a size of a conventional capacitor having no parasitic capacitors (C1) and (C2). In other words, when the parasitic capacitance in the structure of FIG. 2 is accounted for, e.g., when a total capacitance of parallel capacitors (C1), (C2), and (C3) is calculated, the total capacitance may be equivalent to that of the conventional capacitor having no parasitic capacitors (C1) and (C2). As such, the required capacitance of the capacitor (C3) is smaller than that of the conventional capacitor, thereby enabling size reduction of the capacitor 100 relatively to the conventional capacitor. As the size of the capacitor 100 is reduced, an aperture ratio of a pixel including the capacitor 100 as a capacitive element may be increased.

The parasitic capacitor of the capacitor 100 is changeable by a pattern of the gate electrode 12. Another exemplary variation will now be described with reference to FIGS. 3 and 4.

Figure 3:
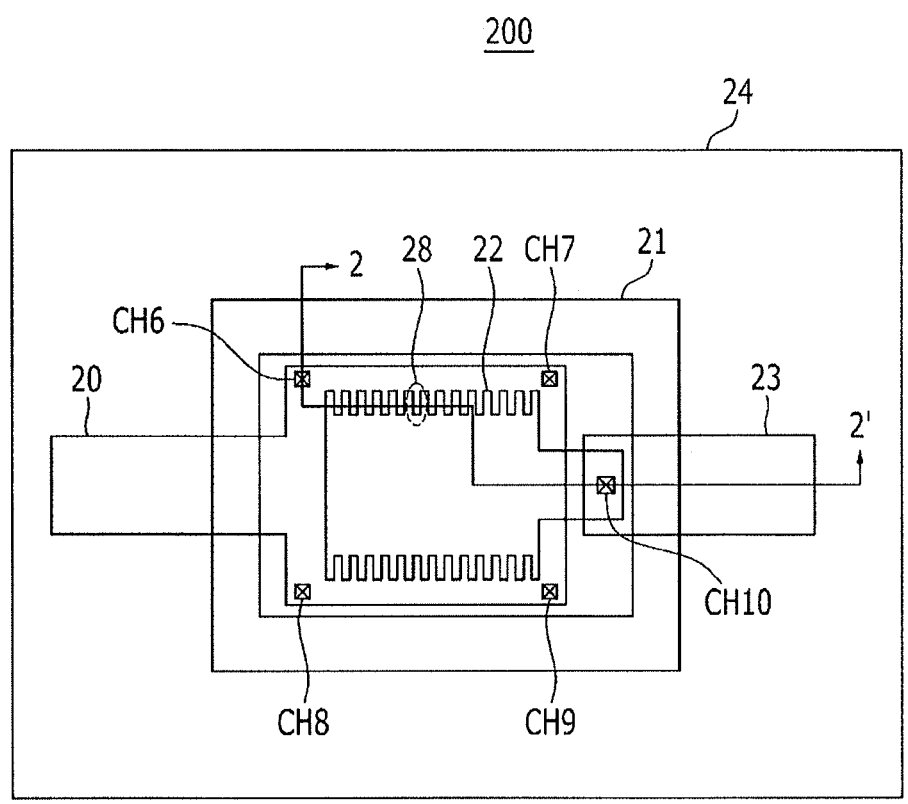
FIG. 3 illustrates a schematic top plan view of a capacitor according to another exemplary embodiment.
Figure 4:
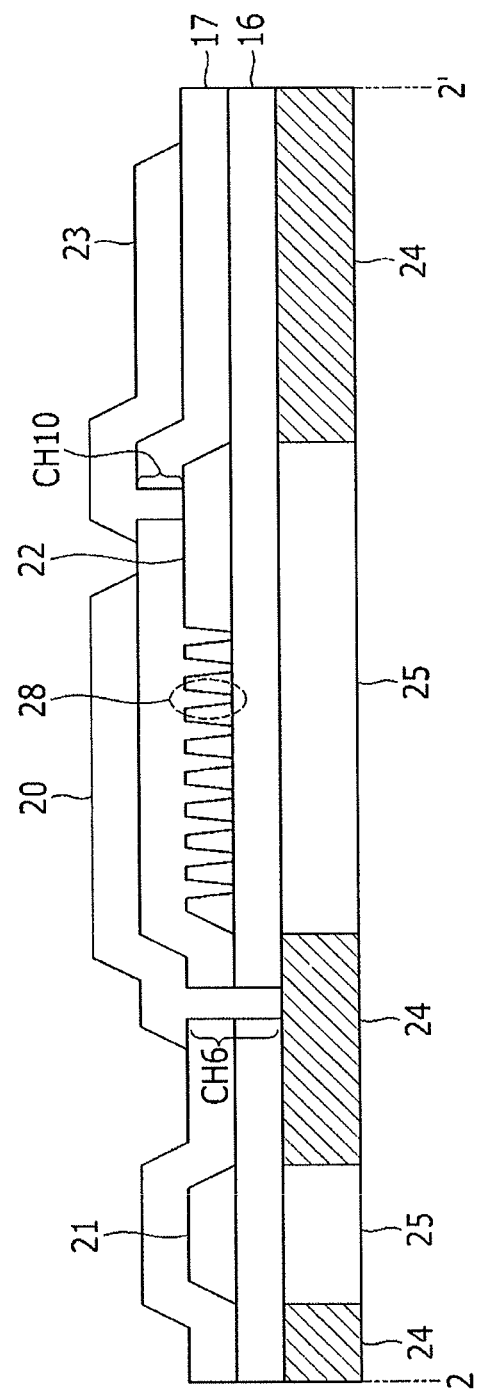
FIG. 4 illustrates a cross-section along line 2-2' in FIG. 3.

FIG. 3 illustrates a top plan view of a capacitor according to another exemplary embodiment. FIG. 4 illustrates a cross-section along line 2-2' of FIG. 3.

The current exemplary embodiment can also use a parasitic capacitor for the purpose of improving capacitance of the capacitor. As shown in FIG. 3, to form a parasitic capacitor, a plurality of grooves is formed on respective sides of a gate electrode, e.g., a gate electrode 22 includes a plurality of grooves 28.

As shown in FIG. 3, a capacitor 200 may include a first electrode 20, which is an upper electrode, and the gate electrode 22, which is a lower electrode. The first electrode 20 is connected to an active layer 24 through contact holes (CH6-CH9). The active layer 24 represents an area generated by doping an intrinsic semiconductor layer with a predetermined impurity. For example, the active layer 24 may be in a P+ doping state.

A second electrode 23 is connected to the gate electrode 22 through a contact hole (CH10). A guard ring 21 intercepts a leakage current between the capacitor 200 and another, e.g., adjacent, capacitor (not shown). The guard ring 21 is shown as a quadrangle for wrapping an area in which the capacitor 200 is formed, but the exemplary embodiment is not limited thereto.

As shown in FIG. 2, an intrinsic semiconductor layer 25 is provided on a same layer as the active layer 24. An area overlapping the area in which the guard ring 21 and the gate electrode 22 are formed is the intrinsic semiconductor layer 25 that is not doped.

A gate insulation layer 26 is formed on the active layer 24 and the intrinsic semiconductor layer 25, and the gate electrode 22 and the guard ring 21 are formed on the gate insulation layer 26. A cross-section of the groove 28 formed on a side of the gate electrode 22 is shown in FIG. 4.

An interlayer insulating layer 27 is formed on the gate insulation layer 26, the gate electrode 22, and the guard ring 21. The first electrode 20 and the second electrode 23 are formed on the interlayer insulating layer 27, the first electrode 20 is connected to the active layer 24 through the contact hole (e.g., CH6 in FIG. 4), and the second electrode 23 is connected to the gate electrode 22 through the contact hole (CH10).

A parasitic capacitor is formed between the active layer 24 and the gate electrode 22 and between the grooves, and the capacitor 200 includes the parasitic capacitor. The first electrode 20 is connected to the active layer 24 through the contact holes (CH6-CH9), and the capacitor in the area in which the first electrode 20 overlaps the gate electrode 22 is connected in parallel to the parasitic capacitor between the gate electrode 22 and the active layer 24. In addition, an outline of the gate electrode 22 is increased by the grooves of the gate electrode 22, and parasitic capacitance between the outline of the gate electrode 22 and the first electrode 20 is increased.

As described previously, the parasitic capacitor between the active layer and the gate electrode and the parasitic capacitor between the outline of the gate electrode and the upper electrode are formed, the electrodes of the parasitic capacitors are electrically connected between the gate electrode and the upper electrode, and the capacitor formed in the area in which the gate electrode overlaps the upper electrode is connected in parallel to the parasitic capacitor.

The upper electrode of the capacitor according to the exemplary embodiments may be formed together with a source or drain electrode layer. For example, when the capacitor according to the exemplary embodiments is used as a capacitive element for a pixel circuit for driving an organic light emitting element, the upper electrode of the capacitor can be used on the same layer as the drain and source electrodes of the transistor configuring the pixel circuit, and the gate electrode that is a lower electrode can be formed on the same layer as the gate electrode of the transistor. The upper electrode can be formed on the drain and source electrode layer of the transistor configuring the driver circuit of the display device as well as the pixel circuit, and the lower electrode can be formed on the gate electrode layer of the transistor. In addition, the capacitor 100 or the capacitor 200 has been shown to include the guard ring (11 or 21) in the exemplary embodiments, which may be omitted.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A capacitor, comprising:
an active layer;
a gate insulation layer on the active layer;
a gate electrode on the gate insulation layer, wherein the gate electrode includes a plurality of grooves;
an interlayer insulating layer on the gate electrode; and
a first electrode on the interlayer insulating layer and connected to the active layer through at least one contact hole.

2. The capacitor as claimed in claim 1, further comprising an intrinsic semiconductor layer overlapping the gate electrode, the intrinsic semiconductor layer and the active layer being on a same layer.

3. The capacitor as claimed in claim 2, further comprising a second electrode on the interlayer insulating layer and connected to the gate electrode through a contact hole.

4. The capacitor as claimed in claim 2, further comprising a parasitic capacitor between the gate electrode and the active layer.

5. The capacitor as claimed in claim 4, wherein a first capacitor, in an area in which the first electrode overlaps the gate electrode, and the parasitic capacitor are connected in parallel.

6. The capacitor as claimed in claim 1, further comprising a parasitic capacitor between the first electrode and an outline of the gate electrode.

7. The capacitor as claimed in claim 1, further comprising an intrinsic semiconductor layer overlapping the gate electrode, the intrinsic semiconductor layer and the active layer being on a same layer.

8. The capacitor as claimed in claim 7, further comprising a first parasitic capacitor between the gate electrode and the active layer.

9. The capacitor as claimed in claim 8, further comprising a second parasitic capacitor between the first electrode and an outline of the gate electrode.

10. The capacitor as claimed in claim 9, wherein a first capacitor, in an area where the first electrode overlaps the gate electrode, the first parasitic capacitor, and the second parasitic capacitor are connected in parallel.

11. The capacitor as claimed in claim 1, further comprising a guard ring surrounding a first capacitor area, the gate electrode overlapping the first electrode in the first capacitor area.

12. The capacitor as claimed in claim 11, wherein the guard ring and the gate electrode are on a same layer.

13. The capacitor as claimed in claim 1, wherein the plurality of grooves include:
a first plurality of grooves on a first edge of the gate electrode as seen from plan view; and
a second plurality of grooves on a second edge of the gate electrode as seen from plan view.

14. The capacitor as claimed in claim 13, wherein the first edge of the gate electrode is opposite the second edge of the gate electrode as seen from plan view.

15. The capacitor as claimed in claim 1, further comprising a guard ring circumventing the gate electrode as seen in plan view, wherein:
the guard ring and the gate electrode are on a same layer, and
the plurality of grooves face the guard ring as seen from plan view.

16. A display, comprising:
an organic light emitting element; and
a pixel circuit configured to drive the organic light emitting element and comprising a capacitor, wherein the capacitor comprises:
an active layer;
a gate insulation layer on the active layer;
a gate electrode on the gate insulation layer, wherein the gate electrode includes a plurality of grooves;
an interlayer insulating layer on the gate electrode; and
a first electrode on the interlayer insulating layer, connected to the active layer through at least one contact hole, and overlapped with the gate electrode.

17. The display as claimed in claim 16, wherein the capacitor comprises a parasitic capacitor between the first electrode and an outline of the gate electrode.

18. The display as claimed in claim 17, wherein:
the capacitor comprises an intrinsic semiconductor layer overlapping the gate electrode, and
the intrinsic semiconductor layer and the active layer are on a same layer.

19. The display as claimed in claim 18, wherein the capacitor further comprises a first parasitic capacitor between the gate electrode and the active layer.

20. The display as claimed in claim 19, wherein the capacitor further comprises a second parasitic capacitor between the first electrode and an outline of the gate electrode.

21. The display as claimed in claim 20, wherein a first capacitor between the first electrode and the gate electrode and the second parasitic capacitor are connected in parallel.

* * * * *